United States Patent [19]

Dowdy et al.

[11] Patent Number: 5,622,770
[45] Date of Patent: Apr. 22, 1997

[54] PRINTED CIRCUIT BOARD DESIGN UTILIZING FLEXIBLE INTERCONNECTS FOR PROGRAMMABLE LOGIC COMPONENTS

[75] Inventors: Gary L. Dowdy; William P. Hart, both of Raleigh, N.C.

[73] Assignee: Square D Company, Palatine, Ill.

[21] Appl. No.: 605,337

[22] Filed: Feb. 9, 1996

Related U.S. Application Data

[63] Continuation of Ser. No. 363,452, Dec. 22, 1994, abandoned.

[51] Int. Cl.$^6$ .................................................. B32B 9/00
[52] U.S. Cl. .................... 428/209; 428/901; 174/254; 174/260; 361/827; 29/832
[58] Field of Search .................................. 428/209, 901; 174/254, 260; 29/832; 361/827

[56] References Cited

U.S. PATENT DOCUMENTS

| | | | |
|---|---|---|---|
| 4,640,010 | 2/1987 | Brown | 29/832 |
| 4,743,489 | 5/1988 | Hasegawa | 428/210 |
| 5,118,556 | 6/1992 | Makino et al. | 428/901 |
| 5,196,268 | 3/1993 | Fritz | 428/901 |
| 5,306,541 | 4/1994 | Kasatani | 428/901 |

Primary Examiner—Patrick Ryan
Assistant Examiner—Cathy Lam
Attorney, Agent, or Firm—Michael J. Femal; Larry I. Golden; Richard J. Graefe

[57] ABSTRACT

A system for modifying a printed circuit board allows parallel design of the printed circuit board and a programmable gate or logic array used on the circuit board. The printed circuit board design can be fixed before the gate array design is complete, which allows for flexibility in pin assignments of the high density integrated circuit mounted on the circuit board. Each pin of the gate array that can vary has a pair of vias connected by a conductive track. Changing signal paths requires cutting this track and using a jumper to make the new connection.

13 Claims, 5 Drawing Sheets

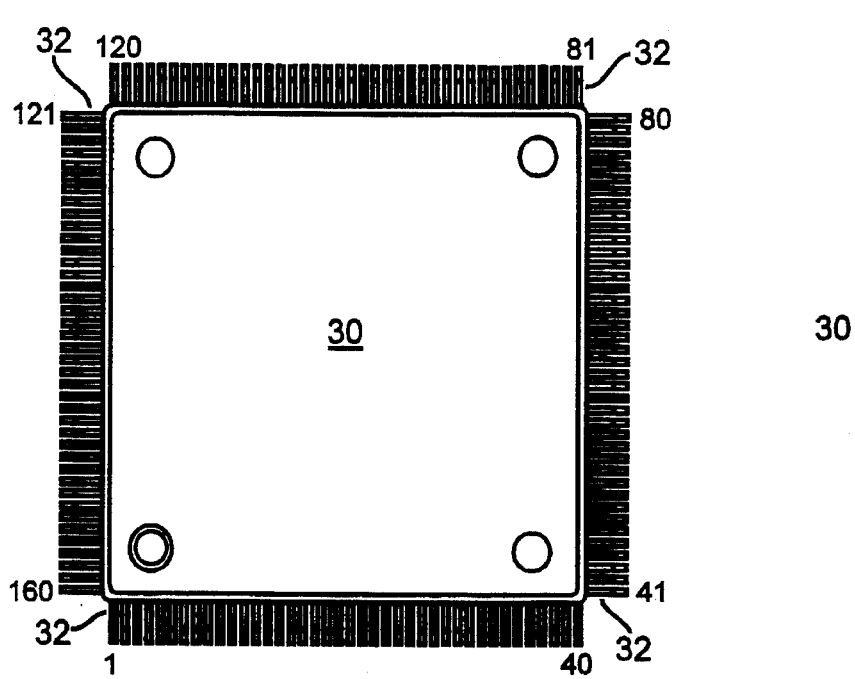
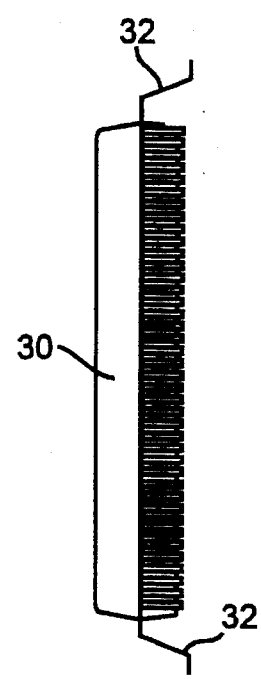
Fig. 2    Fig. 2A
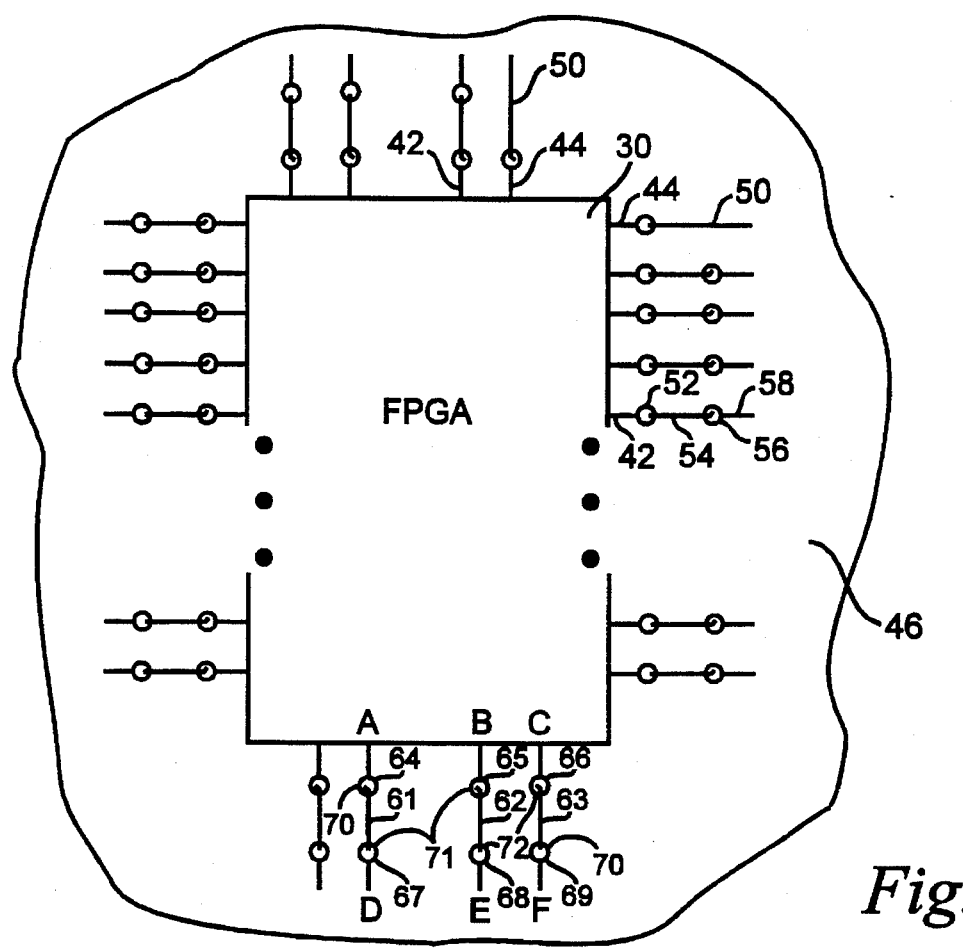
Fig. 3

PRINTED CIRCUIT BOARD DESIGN UTILIZING FLEXIBLE INTERCONNECTS FOR PROGRAMMABLE LOGIC COMPONENTS

This application is a continuation of application Ser. No. 08/363,452, filed on Dec. 22, 1994, now abandoned.

DESCRIPTION

1. Technical Field

Applicant's invention relates generally to the design and board layout of printed circuit boards, and more particularly to a system that allows for parallel design of the printed circuit board and programmable logic devices that are to be mounted on the printed circuit board.

2. Background Art

Many methods have been utilized to decrease product development time cycles. As a means to reduce the design phase, many digital logic designs are created using development software and implementing the design using field programmable gate arrays or FPGAs and other high density programmable logic arrays. The FPGAs are logic devices which allow circuit elements and the connection of these elements to be programmable. These devices are finding increased use in all types of applications. The designer can create, implement and test the design without constructing the actual device. The development software will usually perform logic optimization, mapping and routing of the functional blocks within the gate array. Advances in integrated circuit fabrication technology has allowed packaging of the FPGA in high density packages having as many as 225 external pins for interfacing with other devices. As the number of functions and connections within the device becomes heavily utilized, flexibility of assigning the external pin connection become quite important. Being able to make adjustments to these assignments can have a significant effect on how well the internal resources of the FPGA are used and can be the deciding factor of whether a particular design will fit in the FPGA package.

The FPGA is usually surface mounted to a printed circuit or wiring board containing the other portions of a particular application. Design of the printed circuit board can not be completed until all interconnections between the FPGA and the other portions are defined and fixed. This could add considerable time to the design cycle. A preferred method would be to allow for the FPGA and the printed circuit board to be designed concurrently instead of consecutively.

SUMMARY OF THE INVENTION

Accordingly, the principal object of the present invention is to provide a system for allowing parallel design of a printed circuit board and a programmable gate or logic array used on the circuit board.

A further objective of the invention is to provide a method which allows for a printed circuit board design to be fixed and allows for flexibility in pin assignment of a high density integrated circuit mounted on the circuit board.

Yet a further objective of the invention is to provide a system utilizing a programmable gate array or similar device mounted on a printed circuit board that allows for changes in the gate array without requiring a change in the printed circuit board design.

In one embodiment of the invention, the printed circuit board is designed such that each pinout of the high density integrated circuit is coupled to a first and a second via. A via is a plated through hole on a printed circuit board that allows for connecting conductive signal tracks through various layers of the circuit board. For instance, a signal track may start from a component on the top of the circuit board and use a via to continue the signal track on the bottom side of the board. In the present case, the first via is connected directly to a pin of the integrated circuit and separately, to the second via. The second via is also connected by conductive signal paths to other components on the circuit board as required.

The original design of the printed circuit board will make certain assumptions as to which signal paths are most likely. To make a change after the design has been completed only requires that the connection between the first and second vias be cut for those pins that have to be changed and a conductive jumper be used to connect the first via of one pinout with the second via of the new component. In designs where some pin connections are expected to change, the connection between the first and second vias could be omitted from the original design and all effected pins be connected to external components by jumpers.

Other features and advantages of the invention will be apparent from the following specification taken in conjunction with the accompanying drawings in which there is shown a preferred embodiment of the invention. Reference is made to the claims for interpreting the full scope of the invention which is not necessarily represented by such embodiment.

BRIEF DESCRIPTION OF DRAWINGS

FIGS. 2 and 2a are outlines of a 160 pin field programmable logic device.

FIG. 3 is a detailed diagram illustrating the basic principle of the present invention.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
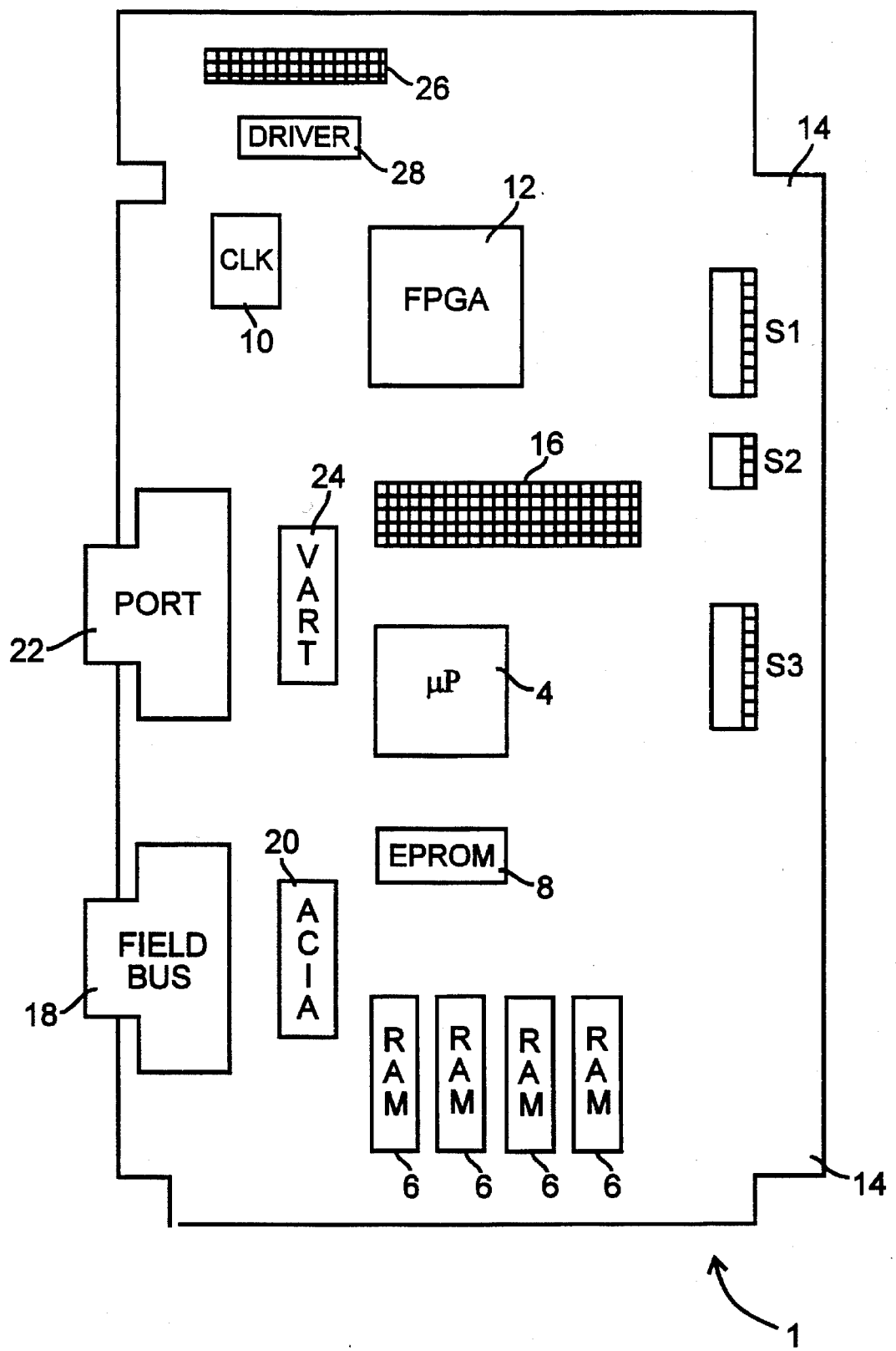
FIG. 1 is a diagram of a typical printed circuit board showing location of various components on circuit board.

FIG. 1 illustrates a typical circuit board assembly 1 with various components mounted on a printed circuit board 2. The circuit board 2 could be double sided or multilayered. A microprocessor 4 is supported by memory chips 6 and 8 and clock 10. A field programmable gate array (FPGA) 12 provides most of the digital logic and means for driving and decoding a data bus and an address bus and for interfacing with input and output devices which are assessable through edge conductors 14 and a multipin connector 16. A field bus connector 18 is interfaced with an asynchronous communication interface adapter 20 which is coupled to the FPGA 12 to send and receive data over a bus network. Another communications port 22 is coupled to UART 24 for serial communications. The circuit board assembly 1 may also contain a display 26 with drivers 28 and programming switches S1, S2, and S3. Not shown are various peripheral chips. Given the complexity of all the components and interconnections shown, the design of the printed circuit board 2 is a major undertaking.

Referring to FIG. 2 and 2A, an outline drawing of a FPGA 30 having 160 pins 32 is shown. This device is mounted to a printed circuit board using surface mounting technology. The placement of a chip of this size has a large impact on the design of the printed circuit board 2. Many of the pins 32 have fixed assignments such as power inputs, reset lines, clock signals, enables, and so on. However, since the functionality of the FPGA 30 is programmable, the pinout of input and output signals can vary considerably. Whereas this allows for ease of change within the FPGA 30, the device is usually soldered to fixed conductive patterns on the printed circuit board 2. This requires a change in the design of the circuit board, resulting in many delays in designing the final printed circuit board 2. Changes in the design of the FPGA 30 often occur as a result of testing the overall board assembly 1, near the end of the design cycle. Some of these changes could be drastic, resulting in different pin assignments of the FPGA 30 and would require a complete printed circuit board redesign. Although a 160 pin device is illustrated, package types are available with 84, 100, 144, and 225 pins.

In the preferred embodiment of the present invention, a system is disclosed in the simplified diagram of FIG. 3 that allows for flexibility in the programming of the FPGA 30, and thus flexibility of the pin assignments. A programmable logic or gate array 40 has multiple pin connections 42, 44 soldered to conductive tracks 46 on printed circuit board 48. Circuit board 48 can be of single or multilayered construction. For those pins 44 having fixed assignments such as power inputs, reset lines, clock signals, and so on, the conductive tracks 50 go directly to other components on the circuit board 48. However, for those pins 42 that are flexible, each conductive track 46 is connected to its own via 52. A conductive track 54 connects via 52 to a second via 56. Conductive tracks 58 then go directly to other components on the circuit board 46 as described on a schematic designation of the printed circuit board. Corresponding vias 52 and 56 for each pin connection 42 are placed adjacent to each other so that easy connectivity can be achieved.

A modification to the connectivity of the various pins can be easily made without a new printed circuit board design. As an example, if pins A, B, and C, originally configured to be connected to points D, E, and F, respectively, are instead required to be connected to F, D, and E, respectively, the conductive tracks 61, 62, and 63 are first cut. This provides an open circuit between vias 64 and 67, 65 and 68, and 66 and 69. Each via is a plated through hole suitable to insert a conductive jumper such as a copper wire. To complete the revised connections, jumpers are inserted into the required vias. Jumper 70 connects via 64 with via 69, jumper 71 connects via 65 with via 67, and jumper 72 connects via 66 with via 68.

This method can be used with any number of FPGA devices having varying pin counts and package types. In addition, this type of procedure is not restricted to programmable gate or logic arrays. It can be used for any type of high density integrated circuit device having flexible pin assignments. Application specific integrated circuits or ASICs would be an example of such a device that would allow parallel design of the printed circuit board and the ASIC without waiting for the ASIC design to be completed. This allows for the printed circuit board to be designed, fabricated, and used much earlier in the design cycle, with a high degree of confidence. The main challenge to this method is to be able to position the via pairs in a way as to not make the printed circuit board so overcrowded with vias that there is no space for the regular conductive tracks. Using surface mount technology and multilayered printed circuit boards, the present invention is possible. When using surface mounting techniques, components can be soldered to both the top and the bottom side of the printed circuit board. This allows for some via pairs to be positioned inside the footprint of the integrated circuit package. After the printed circuit board is assembled, all via pair connections inside the footprint are made on the bottom side of the circuit board.

Figure 4:
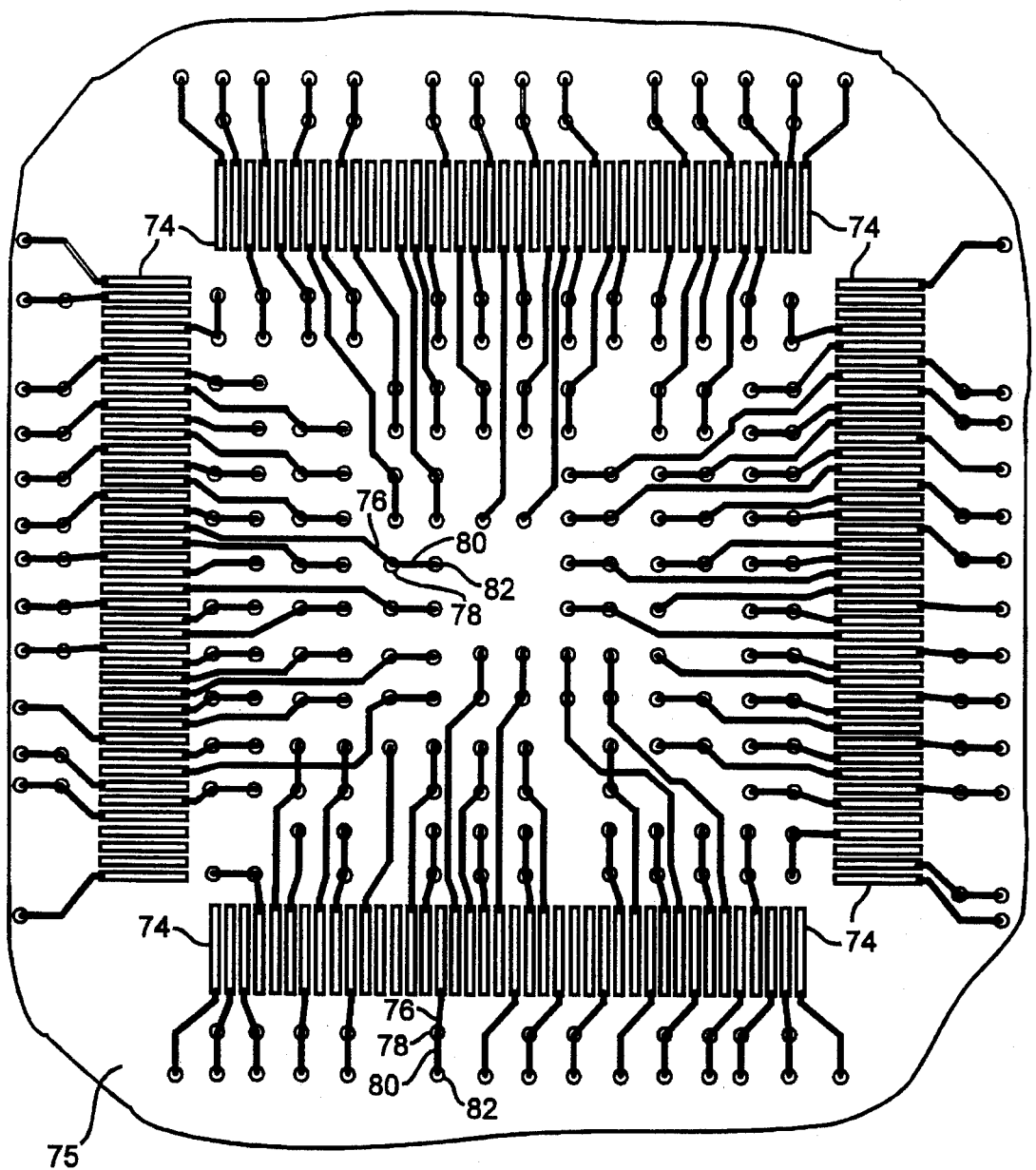
FIG. 4 is a detailed composite top and bottom view of circuit paths for a 160 pin integrated circuit according to the present invention.

FIG. 4 is a detailed composite view of circuit paths on a portion of a printed circuit board 75 for a 160 pin integrated circuit package according to the present invention. The top or component side and bottom or solder side are shown superimposed to illustrate the circuit paths from mounting pads 74 to first vias 78 which is closest to the mounting pads 74 by conductive paths 76 and to second vias 82 by conductive paths 80. Mounting pads 74 mate with corresponding pins 32 of FPGA 30. Although a 160 pin device is shown, it is to be understood that the present invention is not restricted to this type of package and is readily adaptable to any number of pins and devices. Likewise, the circuit patterns shown are meant to be illustrative and are not to be construed as being restrictive to the pattern as shown. Any pattern may be used.

For the present invention, vias 78 and 82 form via pairs for those pins that are considered to be flexible. The footprint for the FPGA 30 is a 28 mm (1.25 in.) square. The footprint is routable with 0.008 in. (8 mil) spacing and 8 mil circuit path width. Each of the vias 78, 82 has a 35 mil diameter and they are configured on a matrix having 75 mil centers. The vias 78, 82 are suitable for securing a jumper post to be used for attaching jumpers when altering the pin assignments of the FPGA 30. The circuit paths from the vias 82 for the conductive tracks that go to other components on the circuit board are not shown. They would generally be located on different layers of the circuit board 75.

Figure 5:
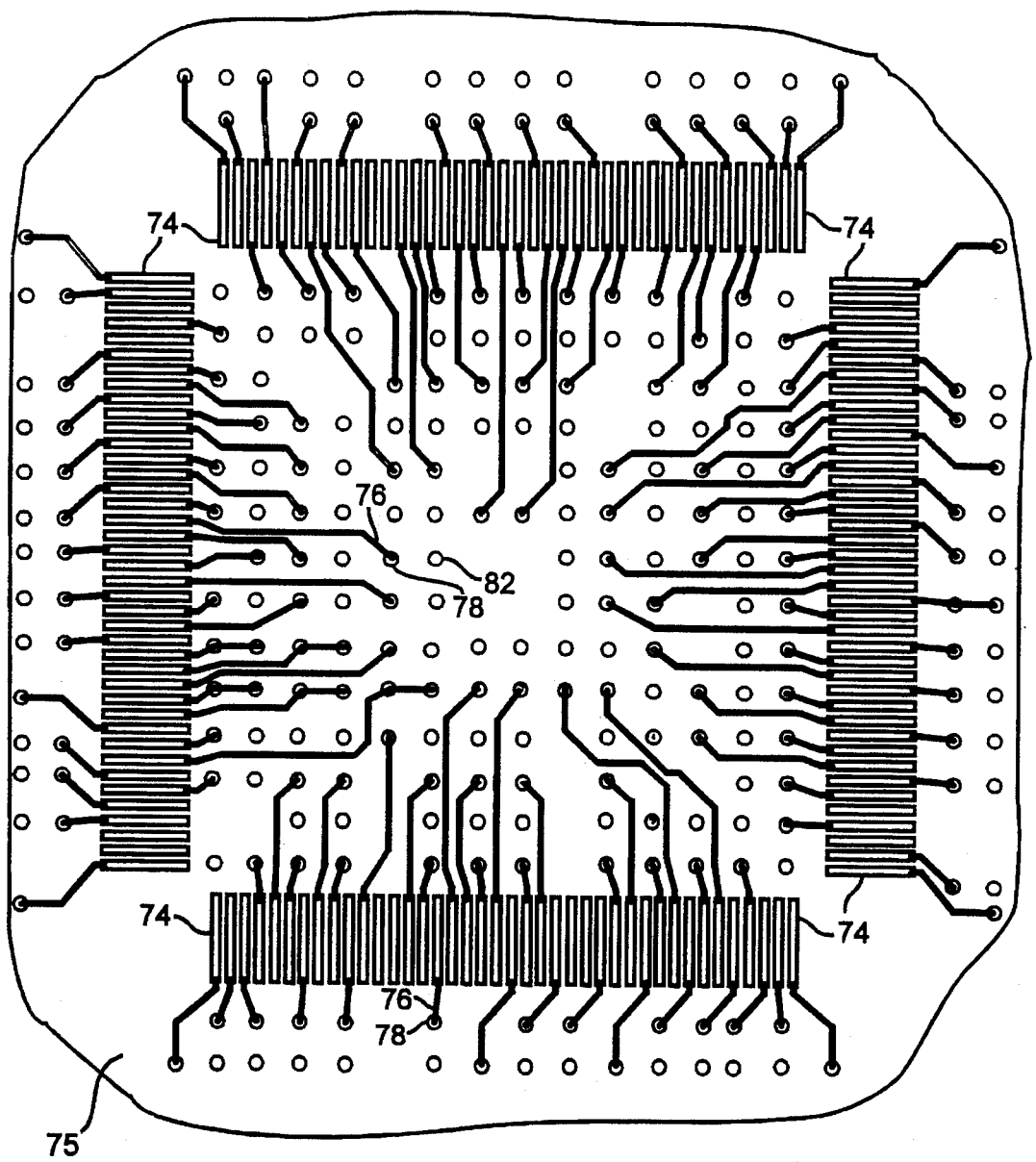
FIG. 5 is a detailed top view of the circuit paths of FIG. 4 according to the present invention.

The component or top side of the circuit board 75 of FIG. 4 is shown in FIG. 5. Since the integrated circuit is mounted on this side all mounting pads 74 are located on this side of the circuit board 75. Connections 76 to the first vias 78 are on this side of the circuit board 75. Missing from the component side are any conductive paths 80 that connect via pairs 78, 82. Jumper posts could be used on those vias that are outside the footprint of the integrated circuit. Likewise jumpers for altering the pin assignments also can only be attached to those vias outside the footprint.

Figure 6:
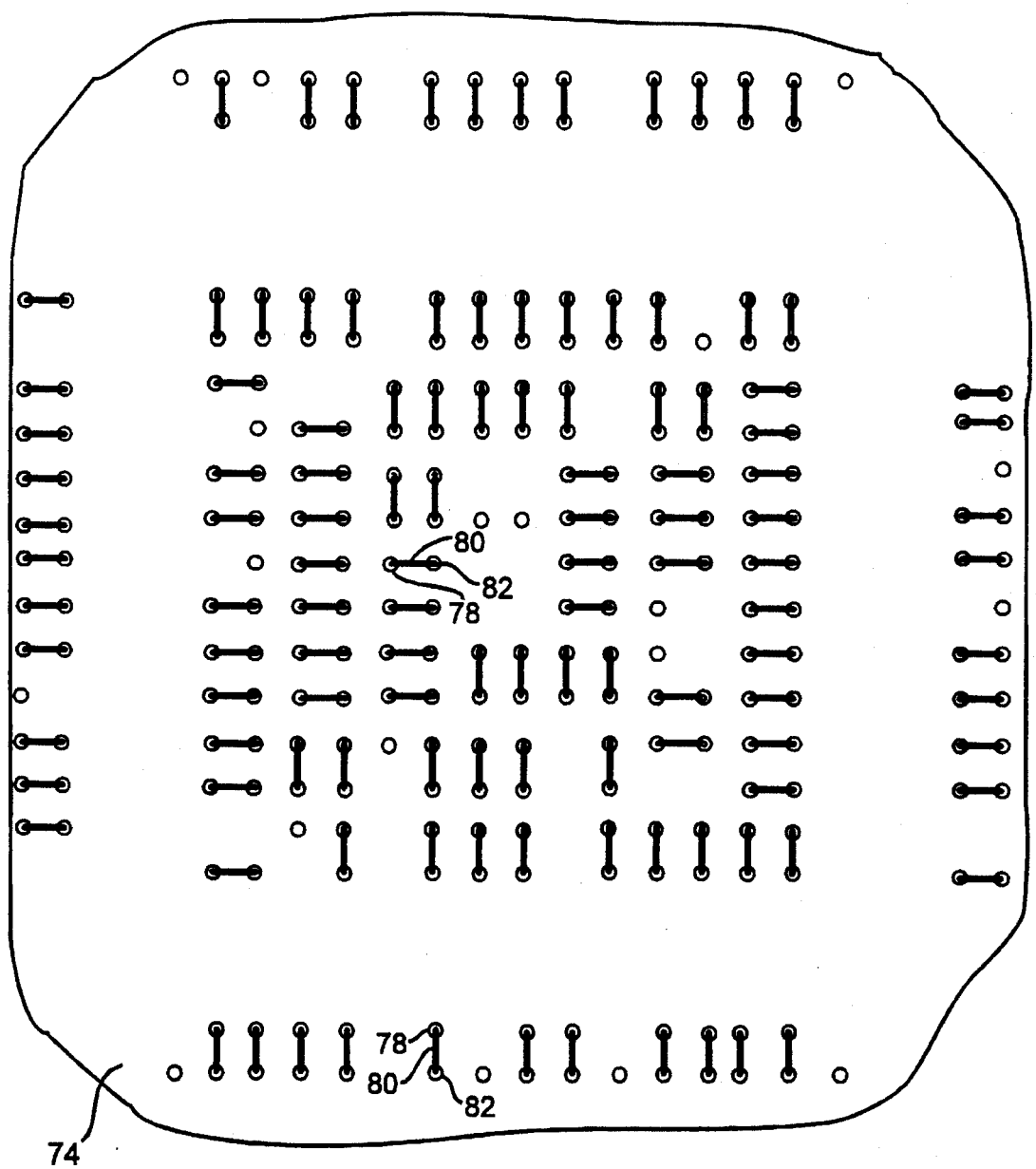
FIG. 6 is a detailed bottom view of the circuit paths of FIG. 4 according to the present invention.

All conductive paths 80 to the via pairs are located on the solder or bottom side of circuit board 75. This is shown in FIG. 6. Since there are no integrated circuit mounting pads on this side of the circuit board 75, there are no conductive paths 76 on this side of the circuit board 75. All via pair connections 80 are on this side of the circuit board so that they are assessable for modifications by cutting the circuit path after the circuit board is assembled. Jumper posts for wirewrap or other commercially available means could also be mounted on this side of the circuit board for those vias located under the integrated circuit footprint. This could facilitate the use of jumpers for the modified routing between the pins of the integrated circuit and the desired vias that go to other components on the circuit board that are not shown.

While the specific embodiments have been illustrated and described, numerous modifications are possible without departing from the scope or spirit of the invention. It is intended that all matter contained in the description thereof or shown in the accompanying drawings shall be interpreted as illustrative and not in a limiting sense.

We claim:

1. A printed circuit board adaptable to vary conductive paths between a multiple pin integrated circuit package and a plurality of circuit components disposed on said top side of said circuit board comprising:

a. a plurality of conductive planes, including a top side and a bottom side;

b. a spaced plurality of electrically conductive mounting pads disposed on said top side, said plurality of mounting pads for electrically and physically coupling each pin of said multiple pin integrated circuit package to the printed circuit board;

c. a plurality of via pairs, each via pair having a first via coupled to one of said plurality of mounting pads by a first conductive path and a second via coupled to said first via by a second conductive path, said first and second vias having a through hole formed from said top side to said bottom side of said circuit board, said through hole having an electrically conductive material plated onto an inside surface, said vias for electrically connecting a conductive path on the top side with a conductive path on the bottom side of said circuit board;

d. a plurality of third conductive paths disposed on said top and bottom sides of said circuit board, each of said plurality of third conductive paths for coupling one of said second vias to one of said plurality of circuit components, providing a complete conductive path from one of said pins of said integrated circuit package to said one circuit component; and e. wherein said second conductive path is adaptable to change said complete conductive path from one of said pins of said integrated circuit package to said one circuit component to a different complete conductive path from said one pin to a different circuit component.

2. The printed circuit board of claim 1 wherein said second conductive path is disposed on said bottom side of said circuit board.

3. The printed circuit board of claim 1 wherein said modifying of said second conductive path includes open circuiting said second conductive path between said first and second vias from one of said pins and connecting a conductive media from said first via to a second via connected to said different circuit component.

4. The printed circuit board of claim 1 wherein said multiple pin integrated circuit package is a programmable gate array.

5. The printed circuit board 0f claim 1 wherein said multiple pin integrated circuit package has more than 100 pins.

6. The printed circuit board of claim 1 wherein said multiple pin integrated circuit package is surface mounted to said printed circuit board.

7. The printed circuit board of claim 6 wherein a portion of said plurality of via pairs are located within a footprint of said multiple pin integrated circuit package.

8. A system of modifying a printed circuit board having a plurality of conductive planes, including a top side and a bottom side, said printed circuit board having a plurality of circuit components disposed on said top side of said circuit board and having a plurality of spaced, electrically conductive mounting pads disposed on said top side, said plurality of mounting pads for electrically and physically coupling each pin of a multiple pin integrated circuit package to the printed circuit board, said system for providing flexible conductive paths between said integrated circuit and said plurality of circuit components and comprising:

a. a plurality of via pairs, each via pair having a first via coupled to one of said plurality of mounting pads by a first conductive path and a second via coupled to said first via by a second conductive path, said first and second vias having a through hole formed from said top side to said bottom side of said circuit board, said through hole having an electrically conductive material plated onto an inside surface, said vias for electrically connecting a conductive path on the top side with a conductive path on the bottom side of said circuit board;

b. a plurality of third conductive paths disposed on said top and bottom sides of said circuit board, each of said plurality of third conductive paths for coupling one of said second vias to one of said plurality of circuit components, providing a complete conductive path from one of said pins of said integrated circuit package to said one circuit component; and c. wherein said complete conductive path from one of said pins of said integrated circuit package to said one circuit component is adaptable to a complete conductive path from said one pin to a different circuit component by cutting and open circuiting said second conductive path between said first and second vias and connecting a conductive media from said first via coupled to said one pin to a second via connected to said different circuit component.

9. The system of modifying a printed circuit board of claim 8 wherein said second conductive path is disposed on said bottom side of said circuit board.

10. The system of modifying a printed circuit board of claim 8 wherein said multiple pin integrated circuit package is a programmable gate array.

11. The system of modifying a printed circuit board of claim 8 wherein said multiple pin integrated circuit package has more than 100 pins.

12. The system of modifying a printed circuit board of claim 8 wherein said multiple pin integrated circuit package is surface mounted to said printed circuit board.

13. The system of modifying a printed circuit board of claim 8 wherein a portion of said plurality of via pairs are located within a footprint of said multiple pin integrated circuit package.

* * * * *